(12) United States Patent
Mikami (10) Patent No.: US 8,946,093 B2
(45) Date of Patent: Feb. 3, 2015

(54) IMPRINT METHOD, IMPRINT APPARATUS, AND METHOD OF MANUFACTURING SEMICONDUCTOR DEVICE

(75) Inventor: Shinji Mikami, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 392 days.

(21) Appl. No.: 13/421,272

(22) Filed: Mar. 15, 2012

(65) Prior Publication Data

US 2013/0078820 A1    Mar. 28, 2013

(30) Foreign Application Priority Data

Sep. 22, 2011    (JP) ................... 2011-208114

(51) Int. Cl.
*H01L 21/3105* (2006.01)
*H01L 21/312* (2006.01)
*G03F 7/00* (2006.01)

(52) U.S. Cl.
CPC .................... *G03F 7/0002* (2013.01)
USPC ......... 438/780; 264/1.37; 264/1.38; 264/447; 257/E21.242

(58) Field of Classification Search
CPC .................................... G03F 7/0002
USPC ................. 438/780; 264/1.37, 1.38, 447; 257/E21.242
See application file for complete search history.

(56) References Cited

U.S. PATENT DOCUMENTS

| | | | |
|---|---|---|---|
| 6,653,030 B2 * | 11/2003 | Mei et al. ........................ 430/5 |
| 6,671,034 B1 * | 12/2003 | Hatakeyama et al. .......... 355/67 |
| 6,954,275 B2 * | 10/2005 | Choi et al. ..................... 356/614 |
| 7,037,639 B2 * | 5/2006 | Voisin ............................ 430/316 |
| 7,070,405 B2 * | 7/2006 | Sreenivasan et al. ....... 425/174.4 |
| 7,136,150 B2 * | 11/2006 | Sreenivasan et al. ........... 355/75 |
| 7,244,665 B2 * | 7/2007 | Benson .......................... 438/465 |
| 7,343,857 B2 * | 3/2008 | Sakuarai et al. .............. 101/483 |
| 7,381,272 B2 * | 6/2008 | Kasumi et al. ................ 118/500 |
| 7,384,809 B2 * | 6/2008 | Donofrio ........................ 438/29 |
| 7,419,770 B2 * | 9/2008 | Ikeda et al. ................... 430/321 |
| 7,632,417 B2 * | 12/2009 | Suh et al. .......................... 216/2 |
| 7,658,601 B2 * | 2/2010 | Kasumi ......................... 425/150 |
| 7,677,877 B2 * | 3/2010 | Wuister et al. ............. 425/174.4 |

(Continued)

FOREIGN PATENT DOCUMENTS

| EP | 1 072 954 | * | 1/2001 | .............. G03F 7/00 |
| EP | 1 072 954 A2 | | 1/2001 | |

(Continued)

OTHER PUBLICATIONS

Notice of Rejection issued by the Japanese Patent Office on Jan. 21, 2014, for Japanese Patent Application No. 2011-208114, and English-language translation thereof.

*Primary Examiner* — Mary Wilczewski
(74) *Attorney, Agent, or Firm* — Finnegan, Henderson, Farabow, Garrett & Dunner, L.L.P.

(57) ABSTRACT

In an imprint method of an embodiment, in the imprinting of an imprint shot including an outermost peripheral region of a substrate where resist is not desired to be entered at the time of imprinting, light curing the resist is applied to a light irradiation region with a predetermined width including a boundary between the outermost peripheral region and a pattern formation region more inside than the outermost peripheral region, whereby the resist which is to enter inside the outermost peripheral region is cured. Then, light curing the resist filled in a template pattern is applied onto a template.

11 Claims, 4 Drawing Sheets

(56) References Cited

U.S. PATENT DOCUMENTS

| | | | |
|---|---|---|---|
| 7,815,425 B2 | 10/2010 | Tokita et al. | |
| 7,927,090 B2 * | 4/2011 | Ten Berge | 425/150 |
| 8,092,209 B2 * | 1/2012 | Ando et al. | 425/385 |
| 8,144,309 B2 * | 3/2012 | Wuister et al. | 355/72 |
| 8,323,541 B2 * | 12/2012 | Schram et al. | 264/85 |
| 8,366,431 B2 * | 2/2013 | Malloy | 425/345 |
| 8,415,010 B2 * | 4/2013 | Liu et al. | 428/336 |
| 8,476,170 B2 * | 7/2013 | Ojima | 438/758 |
| 8,531,649 B2 * | 9/2013 | Hirano et al. | 355/71 |
| 8,550,801 B2 * | 10/2013 | Furutono et al. | 425/139 |
| 8,551,393 B2 * | 10/2013 | Kobayashi | 264/494 |
| 8,574,480 B2 * | 11/2013 | Malloy | 264/293 |
| 8,616,874 B2 * | 12/2013 | Kasumi et al. | 425/400 |
| 8,672,661 B2 * | 3/2014 | Minoda | 425/174.4 |
| 8,709,955 B2 * | 4/2014 | Kobayashi | 438/758 |
| 2004/0091618 A1 * | 5/2004 | Park et al. | 427/248.1 |
| 2005/0037143 A1 * | 2/2005 | Chou et al. | 427/248.1 |
| 2005/0230346 A1 | 10/2005 | Kasumi et al. | |
| 2007/0007675 A1 * | 1/2007 | Nakagawa | 264/1.7 |
| 2007/0037307 A1 * | 2/2007 | Donofrio | 438/42 |
| 2007/0104813 A1 * | 5/2007 | Wuister et al. | 425/174.4 |
| 2009/0256287 A1 * | 10/2009 | Fu et al. | 264/447 |
| 2009/0261514 A1 * | 10/2009 | Uchida | 264/446 |
| 2010/0031833 A1 | 2/2010 | Kasumi et al. | |
| 2010/0055611 A1 * | 3/2010 | Kim et al. | 430/280.1 |
| 2010/0104984 A1 * | 4/2010 | Shiobara et al. | 430/319 |
| 2010/0330807 A1 * | 12/2010 | Kobayashi | 438/689 |
| 2011/0014499 A1 * | 1/2011 | Uchida et al. | 428/846 |
| 2011/0064871 A1 * | 3/2011 | Uchida et al. | 427/130 |
| 2011/0076353 A1 * | 3/2011 | Shirai et al. | 425/385 |
| 2011/0318501 A1 * | 12/2011 | Saito | 427/510 |
| 2012/0200006 A1 * | 8/2012 | Minoda | 264/293 |
| 2013/0059090 A1 * | 3/2013 | Kawamura | 427/511 |
| 2013/0078820 A1 * | 3/2013 | Mikami | 438/778 |
| 2013/0122708 A1 * | 5/2013 | Malloy | 438/694 |
| 2013/0196122 A1 * | 8/2013 | Park et al. | 428/195.1 |
| 2014/0061969 A1 * | 3/2014 | Okamoto et al. | 264/293 |
| 2014/0124971 A1 * | 5/2014 | Kruijt-Stegeman et al. | 264/40.5 |

FOREIGN PATENT DOCUMENTS

| | | | | |
|---|---|---|---|---|
| JP | 2000-194142 | 7/2000 | | |
| JP | 2001-68411 | 3/2001 | | |
| JP | 2005-286061 | 10/2005 | | |
| JP | 2005-286062 | 10/2005 | | |
| JP | 2009-283093 | 12/2009 | | |
| JP | 2010-40879 | 2/2010 | | |
| WO | WO 2009/110596 | * | 11/2009 | G11B 5/855 |
| WO | WO 2010/042141 | * | 4/2010 | G03F 7/00 |

\* cited by examiner

IMPRINT METHOD, IMPRINT APPARATUS, AND METHOD OF MANUFACTURING SEMICONDUCTOR DEVICE

CROSS-REFERENCE TO RELATED APPLICATIONS

This application is based upon and claims the benefit of priority from Japanese Patent Application No. 2011-208114, filed on Sep. 22, 2011; the entire contents of which are incorporated herein by reference.

FIELD

An embodiment described herein relates generally to an imprint method, an imprint apparatus, and a method of manufacturing a semiconductor device.

BACKGROUND

In a process for manufacturing a semiconductor device, as a technique for simultaneously realizing the formation of a fine pattern of not more than 100 nm and mass productivity, an optical nanoimprint method of transferring a pattern of an original plate (template pattern) on a transferred substrate (such as a wafer) has attracted attention. In the optical nanoimprint method, a template formed with a pattern to be transferred is pressed against a photocurable material layer (resist layer) coated on a wafer, and the resist layer is cured by light irradiation, whereby the pattern is transferred to the resist layer. The optical nanoimprint method is expected to be applied to semiconductor lithography.

In the optical nanoimprinting, when a template is pressed against resist coated on a shot (edge shot) of a wafer outer peripheral portion by an ink jet method, the resist is spread due to the surface tension. Then, the resist spreads to the rear surface side of the wafer across a resist elimination region provided at the wafer outer peripheral portion. Thus, the rear surface of the wafer may be contaminated. Further, the resist spreads on a template surface on the resist elimination region and in a template pattern portion (recess). Thus, the cured resist stuck to the template side may be peeled from the template.

Thus, there is a problem that yield is reduced by contamination of the wafer rear surface and peeling of the resist. Further, a semiconductor manufacturing device is contaminated by the contamination of the wafer rear surface and the peeling of the resist, so that since the contamination is required to be removed, there is a problem an operating rate is reduced. Thus, it is desirable to perform imprinting while preventing resist from spreading in an undesired region of a substrate outer peripheral portion.

DETAILED DESCRIPTION

In general, according to one embodiment, an imprint method is provided. In the imprint method, resist is dropped in a pattern formation region more inside than an outermost peripheral region as a region on a substrate where the resist is not desired to be entered at the time of imprinting. Then, a template pattern of a template is pressed against the resist on the substrate for each imprint shot, whereby the resist is filled in the template pattern for each imprint shot. In the imprinting of the imprint shot including the outermost peripheral region, when the template pattern is pressed against the resist, light curing the resist is applied to a light irradiation region with a predetermined width including a boundary between the outermost peripheral region and the pattern formation region, whereby the resist which is to enter inside the outermost peripheral region is cured. Then, light curing the resist filled in the template pattern is applied onto the template.

Exemplary embodiments of an imprint apparatus, and a method of manufacturing a semiconductor device will be explained below in detail with reference to the accompanying drawings. The present invention is not limited to the following embodiment.

Embodiment

Figure 1:
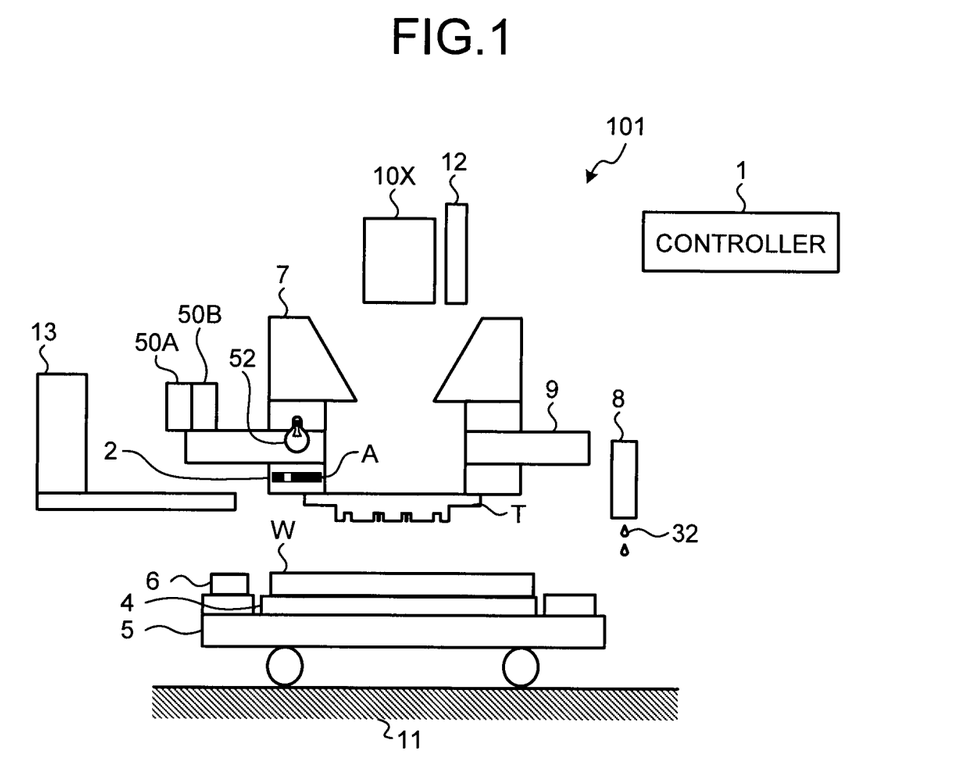
FIG. 1 is a view illustrating a configuration of an imprint apparatus according to an embodiment.

FIG. 1 is a view illustrating a configuration of an imprint apparatus according to an embodiment. An imprint apparatus 101 performs imprint lithography such as optical nanoimprint lithography and transfers a template pattern (such as a circuit pattern) of a template (original plate) T to a transferred substrate (processed substrate) such as a wafer W.

In the imprint apparatus 101 of the present embodiment, when a shot (edge shot) of an outer peripheral portion of the wafer W is imprinted, UV light is applied to a resist elimination region (outermost peripheral region) provided at the outer peripheral portion of the wafer W and a region slightly more inside than the resist elimination region. According to this constitution, the resist entering the resist elimination region is cured by UV light, so that the resist is prevented from entering the resist elimination region.

The imprint apparatus 101 is provided with a controller 1, an original plate stage 2, a substrate chuck 4, a sample stage 5, a reference mark 6, an alignment sensor 7, a liquid dropping device 8, a stage base 9, a UV light source (first light irradiation unit) 10X, a plate stage 11, a CCD (Charge Coupled Device) camera 12, an original plate conveyance arm 13, a UV light source (second light irradiation unit) 52 for outer periphery, an aperture A, an aperture moving unit 50A, and a UV light source moving unit 50B for outer periphery.

The plate stage 11 has a horizontal main surface, and the sample stage 5 moves on the main surface. The sample stage 5 places the wafer W thereon and moves in a plane (horizontal plane) parallel to the wafer W placed thereon. When resist 32 as a transfer material is dropped on the wafer W, the sample stage 5 moves the wafer W downward the liquid dropping device 8. When imprinting processing is applied to the wafer W, the sample stage 5 moves the wafer W downward the template T.

The template T has a groove (concaves and convexes) with a desired pattern as a template pattern. The template T is produced using a material through which light (such as UV light) curing a UV curable resin is transmitted.

The substrate chuck 4 is provided on the sample stage 5. The substrate chuck 4 fixes the wafer F to a predetermined position on the sample stage 5. The reference mark 6 is provided on the sample stage 5. The reference mark 6 is used for detecting the position of the sample stage 5 and used when the wafer W is loaded on the sample stage 5.

The stage base 9 supports the template T and so on and, at the same time, presses the template pattern of the template T against the resist 32 on the wafer W. The stage base 9 moves in an up and down direction (vertical direction), whereby pressing the template T against the resist 32 (imprinting) and releasing of the template T from the resist 32 (demolding) are performed.

The original plate stage 2 is provided on the bottom surface side (wafer W side) of the stage base 9. The original plate stage 2 is fixed to a predetermined position from the rear surface side of the template T (surface on the side on which the template pattern is not formed) by vacuum contact or the like.

The alignment sensor 7 is provided on the stage base 9. The alignment sensor 7 performs position detection of an alignment mark provided on the wafer W and an alignment mark provided on the template T. When alignment of the template T is performed with respect to an imprint shot on the wafer W, the position of the sample stage 5 on which the wafer W is placed is controlled so that the alignment mark of the template T and the alignment mark of the wafer W overlap each other.

The liquid dropping device 8 drops the resist 32 on the wafer W. The resist 32 is a UV curable resin, for example. The liquid dropping device 8 is an ink-jet resist dropping device, for example.

The UV light source 10X is a light source irradiating UV light and is provided above the stage base 9. After the filling of the resist 32 in the template pattern, the UV light source 10X applies UV light to the entire surface of the imprint shot from above the template T in such a state that the template T is pressed against the resist 32.

The UV light source 52 for outer periphery applies the UV light to a predetermined region on the template T (on the imprint shot). The UV light source 52 for outer periphery 52 irradiates the UV light from above the resist elimination region provided in the edge shot. The resist elimination region is the outermost peripheral portion of the wafer W and a region where the resist 32 is not desired to be entered (undesired region).

The aperture A is opened only in a predetermined region corresponding to a curing light irradiation region 31 so that the UV light is applied to the resist elimination region and a region (the curing light irradiation region 31) slightly more inside than the resist elimination region, and, at the same time, the UV light is prevented from applying to other region. The aperture A has a substantially flat plate shape, for example. The aperture A is arranged so that the main surface of the wafer W, the main surface of the template T, and the main surface of the aperture A are parallel to each other. When the edge shot is imprinted, the aperture A is moved on the curing light irradiation region 31 (near the resist elimination region). The UV light from the UV light source 52 for outer periphery is applied to the curing light irradiation region 31 through the aperture A.

The aperture moving unit 50A supports the aperture A and moves the aperture A in a plane (horizontal plane) parallel to the main surface of the aperture A. The aperture moving unit 50A moves the aperture A in an X direction in the horizontal plane and a Y direction in the horizontal plane. The aperture moving unit 50A rotates the aperture A in the horizontal plane.

When the edge shot of the wafer W is imprinted, the aperture moving unit 50A moves the aperture A to the inside of the imprint shot. Then, the aperture moving unit 50A rotates the aperture A in the horizontal plane so that the opening of the aperture A is provided above the curing light irradiation region 31. In other words, the aperture moving unit 50A rotates the aperture A in the horizontal plane for each imprint shot so that the UV light is applied to the curing light irradiation region 31. When other than the edge shot of the wafer W (shot at the central portion) is imprinted, the aperture moving unit 50A moves the aperture A outside the imprint shot.

The UV light source moving unit 50B for outer periphery supports the UV light source 52 for outer periphery and moves the UV light source 52 for outer periphery in a plane (horizontal plane) parallel to the main surface of the aperture A. The UV light source moving unit 50B for outer periphery moves the UV light source 52 for outer periphery in the X direction in the horizontal plane and the Y direction in the horizontal plane.

When the edge shot of the wafer W is imprinted, the UV light source moving unit 50B for outer periphery moves the UV light source 52 for outer periphery to above the opening of the aperture A and is turned on. When other than the edge shot of the wafer W (shot at the central portion) is imprinted, the UV light source moving unit 50B for outer periphery moves the UV light source 52 for outer periphery outside the imprint shot and turns off the UV light source 52 for outer periphery.

In the present embodiment, when the edge shot is imprinted, light with a wavelength curing a UV curable resin is applied to the curing light irradiation region 31 by the UV light source 52 for outer periphery. Consequently, before the resist 32 is diffused in the resist elimination region, the resist 32 is cured near a boundary between the curing light irradiation region 31 irradiated with the UV light by the UV light source 52 for outer periphery and a region not irradiated with the UV light.

The CCD camera 12 images the resist 32 being filled in the template pattern of the template T through the substantially transparent template T. The CCD camera 12 is provided above the stage base 9.

The original plate conveyance arm 13 conveys the template T in the imprint apparatus 101. The original plate conveyance arm 13 conveys the template T, conveyed from outside the imprint apparatus 101, to the position of the original plate stage 2.

The controller 1 controls the original plate stage 2, the substrate chuck 4, the sample stage 5, the alignment sensor 7, the liquid dropping device 8, the stage base 9, the UV light source 10X, the plate stage 11, the CCD camera 12, the original plate conveyance arm 13, the UV light source 52 for outer periphery, the aperture A, the aperture moving unit 50A, and the UV light source moving unit 50B for outer periphery.

When imprinting is applied to the wafer W, the resist 32 is previously dropped on the wafer W. Specifically, the resist 32 as a material solidified by light irradiation is coated on only an effective region (pattern formation region) of the imprint shot (corresponding to one shot) on the wafer W.

After that, the wafer W is moved directly below the template T. Then, the template pattern is pressed against the resist 32 on the wafer W. Consequently, the resist 32 is started to be filled in the template pattern.

After the completion of the filling of the resist in the template pattern, the UV light is applied to the entire surface of the template T, whereby all the resist 32 is cured. After that, the template T is released from the resist 32. Consequently, a transfer pattern corresponding to the template pattern is patterned on the wafer W.

The imprint apparatus 101 applies the UV light from the UV light source 52 for outer periphery to the curing light irradiation region 31 during the filling of the resist 32 in the template pattern, for example. The imprint apparatus 101 may apply the UV light from the UV light source 52 for outer periphery to the curing light irradiation region 31 during the alignment of the template T to the wafer W.

Figure 2:
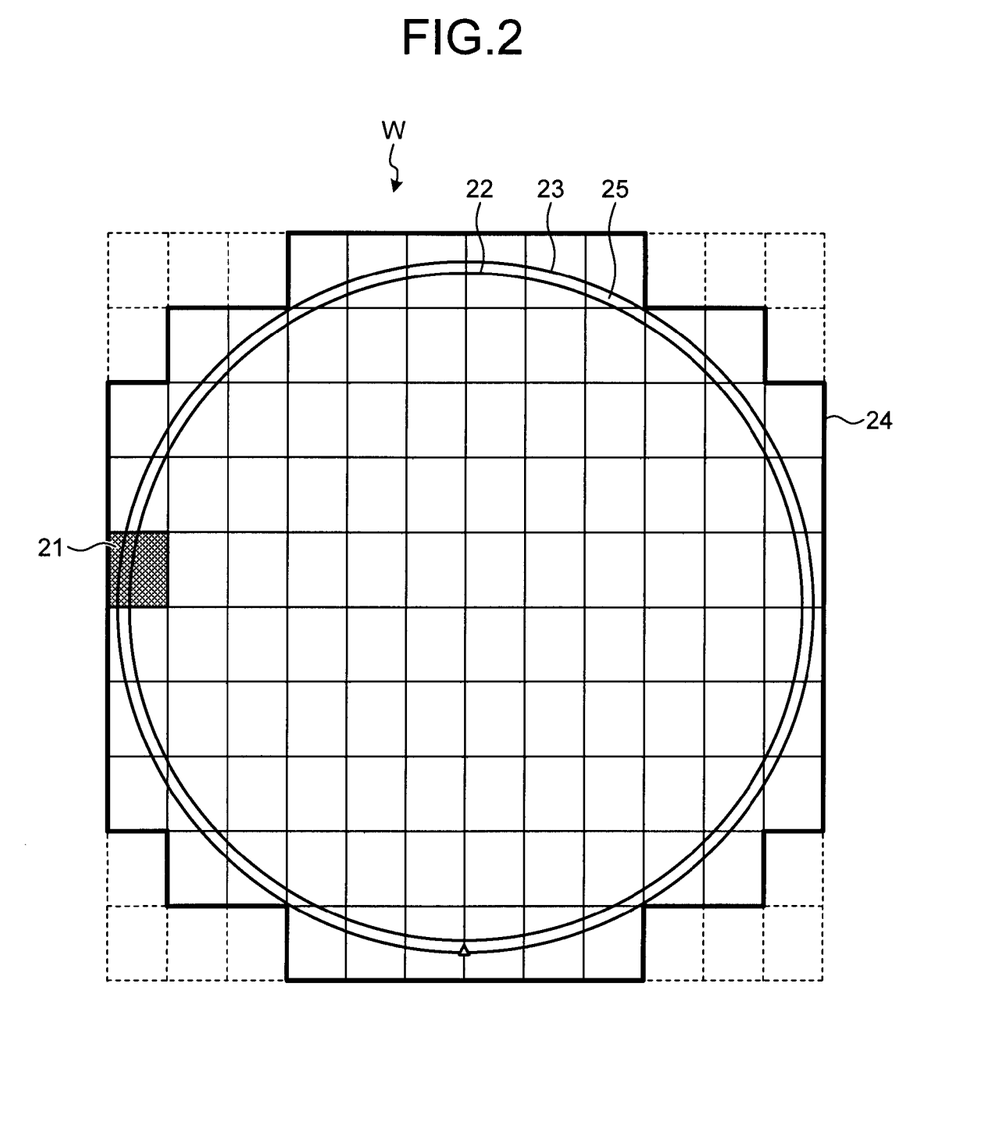
FIG. 2 is a view for explaining an edge shot and a resist elimination region.

FIG. 2 is a view for explaining the edge shot and the resist elimination region. FIG. 2 is a top view of the wafer W. The outermost periphery of the wafer W is a line 23, and a line 22 is provided slightly more inside than the line 23. The imprint pattern is formed in a region (imprint pattern formation region) more inside than the line 22. A region held between the lines 22 and 23 is a resist elimination region 25. In other words, the line 22 is a boundary between the resist elimination region 25 and the imprint pattern formation region.

A plurality of imprint shots are set in the wafer W. Rectangular regions illustrated more inside than a line 24 are imprint shots. Among the imprint shots, the imprint shot having a region overlapping the resist elimination region 25 even in part is an edge shot 21. In other words, the edge shot 21 includes a portion of the resist elimination region 25 in its shot region.

Figure 3:
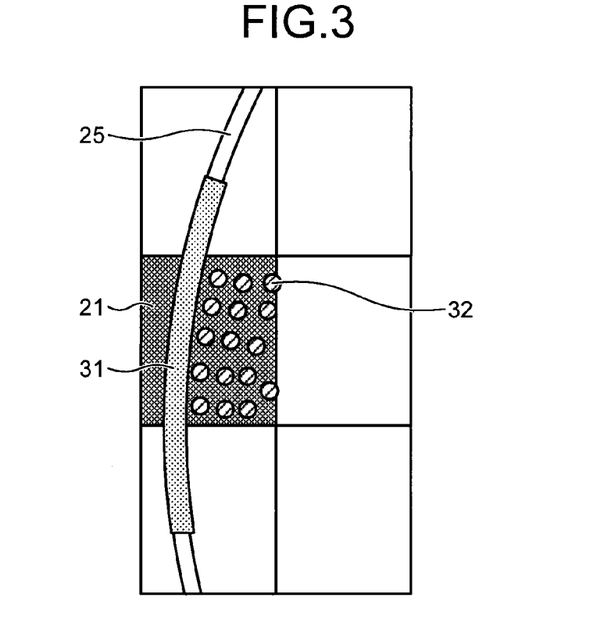
FIG. 3 is a view for explaining a resist dropping position in the edge shot.

FIG. 3 is a view for explaining a resist dropping position in the edge shot. Since the edge shot 21 overlaps a portion of the resist elimination region 25, the resist 32 is not required to be coated on the entire region in the shot. In the edge shot 21, a region required to be coated with the resist 32 is a region (free from the resist elimination region 25) provided more inside than the resist elimination region 25. Accordingly, when the edge shot 21 is imprinted, the resist 32 is dropped on a region more inside than the resist elimination region 25 (the curing light irradiation region 31). The curing light irradiation region 31 has an arbitrary width including the boundary (line 22) between the resist elimination region 25 and the imprint pattern formation region.

In the present embodiment, when the edge shot 21 is imprinted, the UV light is applied to the curing light irradiation region 31. Specifically, the UV light is applied to the curing light irradiation region 31 simultaneously with or before the pressing of the template T against the resist 32. Before the completion of the filling of the resist 32 in the template pattern, while the template T is brought into contact with the resist 32, the UV light continues to be applied to the curing light irradiation region 31.

According to the above constitution, when the imprint pattern is formed at the edge shot 21 overlapping the resist elimination region 25, the resist 32 can be solidified immediately before the resist 32 reaches the resist elimination region 25, and the resist 32 can be prevented from spreading. Accordingly, the resist 32 does not enter inside the resist elimination region 25, and the imprint pattern can be formed on the wafer W center side of the edge shot 21 (pattern formation region). Consequently, the number of devices obtained from the single wafer W is increased, and the device productivity is dramatically improved.

When the resist 32 is cured at a boundary (near the line 22) between the curing light irradiation region 31 and the region more inside than the curing light irradiation region 31, so that the resist 32 does not enter inside the curing light irradiation region 31, the irradiation of the UV light may be stopped before the completion of the filling of the resist 32.

Figure 4:
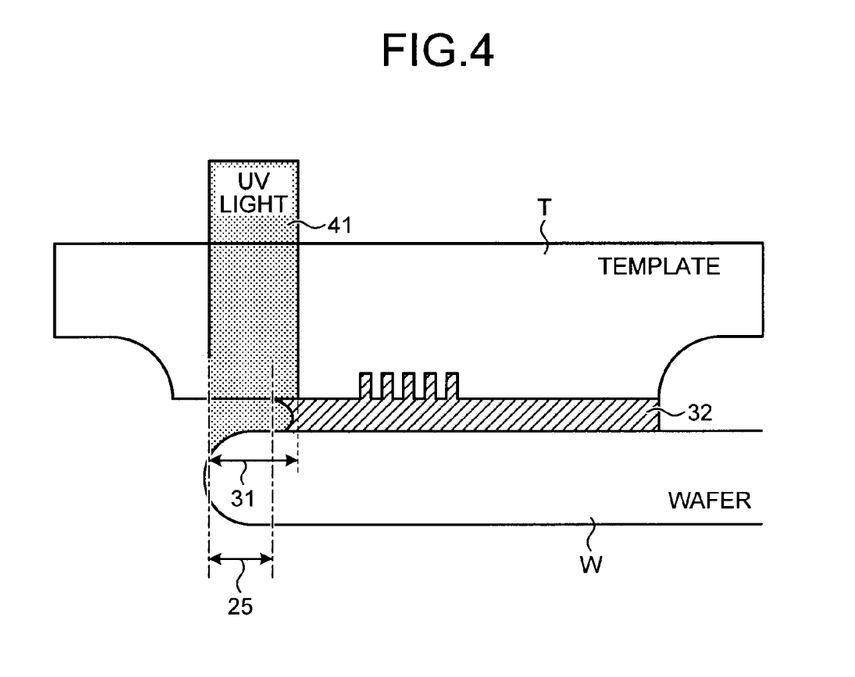
FIG. 4 is a view illustrating a UV light irradiation region according to the embodiment.

FIG. 4 is a view illustrating a UV light irradiation region according to the embodiment. As illustrated in FIG. 4, in the present embodiment, when the template T is pressed against the resist 32, UV light 41 is applied to the curing light irradiation region 31. Consequently, if the resist 32 is to move inside the resist elimination region 25 during the filling of the resist in the template pattern, for example, the resist 32 is cured by the UV light 41 in a region on the inner peripheral side of the curing light irradiation region 31 (a region between the resist elimination region 25 and the dropping position of the resist 32). Accordingly, the resist 32 does not protrude outward from a region irradiated with the UV light 41.

When imprinting is performed at each of the edge shots 21 on the wafer W, the UV light 41 is applied to the curing light irradiation region 31 with respect to each of the edge shots 21. Consequently, in each of the edge shots 21, the resist 32 can be prevented from spreading in an undesired region.

After the completion of the filling of the resist in the template pattern, the UV light 41 is applied from the UV light source 10X to all the imprint shots through the template T. At this time, the aperture moving unit 50A moves the aperture A outside the imprint shot, and, at the same time, the UV light source moving unit 50B for outer periphery moves the UV light source 52 for outer periphery outside the imprint shot. The irradiation with the UV light 41 from the UV light source 10X cures the resist 32 filled in the template pattern. After that, the template T is released from the resist 32, whereby the template pattern is transferred to the resist 32.

Figure 5:
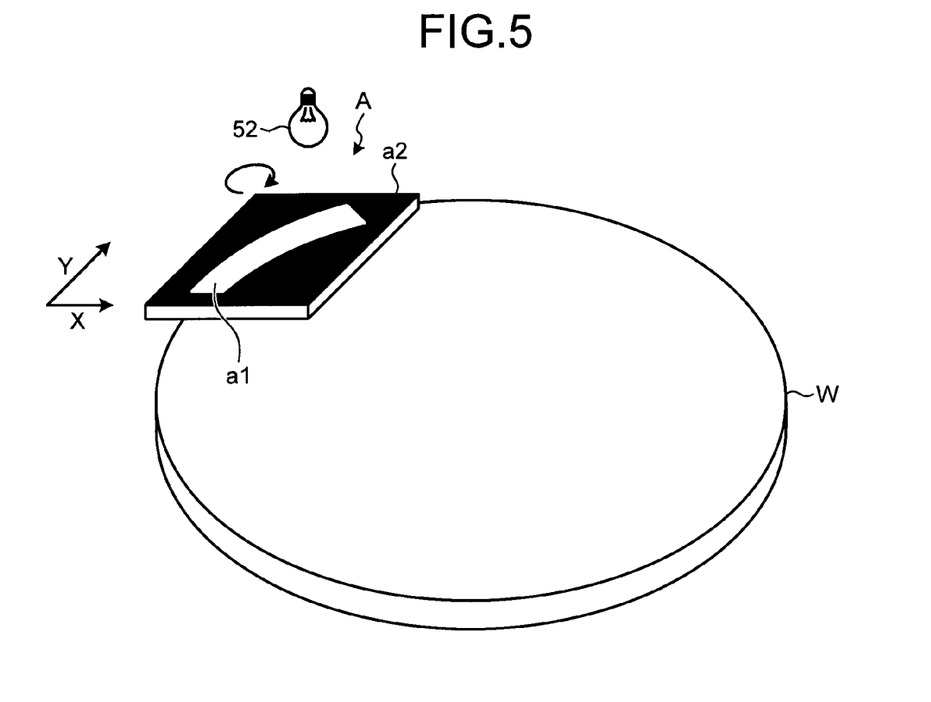
FIG. 5 is a view for explaining movement of an aperture.

Subsequently, the movement processing of the aperture A will be described. FIG. 5 is a view for explaining the movement of the aperture. The aperture A has a light shielding portion a2 shielding the UV light from the UV light source 52 for outer periphery and an opening a1 through which the UV light is passed. The opening a1 has a fan shape corresponding to the shape of the resist elimination region 25, for example. The outer diameter and the inner diameter of the fan shape of the opening a1 are parallel to the outer diameter of the wafer W (the resist elimination region 25). In other words, the opening shape a1 has a shape substantially similar to the curing light irradiation region 31.

When imprinting is performed, the imprint shot to be imprinted moves downward the template T. When the imprint shot is the edge shot, the aperture A is moved in a plane parallel to the main surface of the aperture A, whereby the aperture A is moved above the template T. Then, the aperture A is rotated in a plane parallel to the main surface of the aperture A, whereby the opening a1 of the aperture A is moved on the resist elimination region 25. In other words, when the aperture A is viewed from the top surface, the aperture A is rotated so that the resist elimination region 25 and the opening a1 substantially overlap each other. The UV light source 52 for outer periphery is further moved above the opening a1.

After that, the UV light from the UV light source 52 for outer periphery is applied to the curing light irradiation region 31 through the opening a1, and, at the same time, the resist 32 is filled in the template pattern. Thereafter, the UV light source 52 for outer periphery is turned off, and the UV light source 52 for outer periphery and the aperture A are moved outside the template T. Then, the UV light from the UV light source 10X is applied to the resist 32 through the template T in such a state that the template T is pressed against the resist 32. After the resist 32 is cured, the resist 32 is released from the template T.

In the wafer W, a processing of moving the imprint shot to be imprinted downward the template T, a processing of filling the resist 32 in the template pattern at each imprint shot, a processing of applying the UV light from the UV light source 10X to the resist 32 and curing the resist 32, and a processing of releasing the template T from the resist 32 are repeated. When the imprint shot is the edge shot, the resist 32 is filled while the UV light from the UV light source 52 for outer periphery is applied to the curing light irradiation region 31 through the opening a1. Consequently, in the wafer W, the template pattern is transferred at all the imprint shots.

As described above, in the present embodiment, when the edge shot is imprinted, the UV light is applied to the curing light irradiation region 31, and therefore, the resist 32 does not enter the resist elimination region 25, the rear surface of the wafer W, the template pattern on the resist elimination region 25, and so on. Thus, the resist elimination region 25, the rear surface of the wafer W, and the template pattern on the resist elimination region 25 can be prevented from being contaminated. Accordingly, reduction in yield can be prevented. Further, since contamination of a semiconductor manufacturing apparatus can be prevented, reduction of operating rate in the semiconductor manufacturing apparatus can be prevented.

The UV light may be applied to the curing light irradiation region 31 without using the aperture A, instead of using the aperture A. In this case, a UV light source for outer periphery which can irradiate the curing light irradiation region 31 is provided in the imprint apparatus 101.

Figure 6:
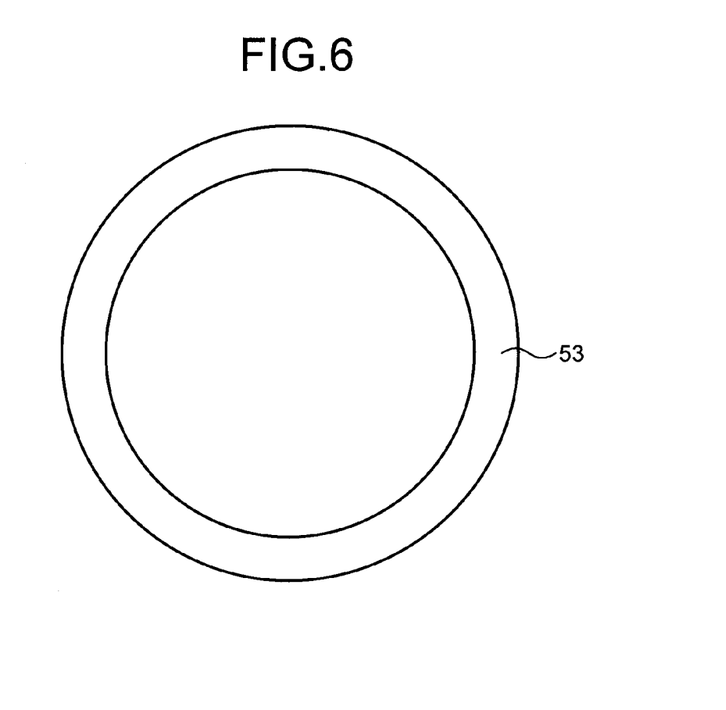
FIG. 6 is a view illustrating another configuration example of a UV light source for outer periphery.

FIG. 6 is a view illustrating another configuration example of a UV light source for outer periphery. FIG. 6 is a top view of a UV light source (second light irradiation unit) 53 for outer periphery. The UV light source 53 for outer periphery is a ring-shaped UV light source and applies UV light to a ring-shaped region on the wafer W. The UV light source 53 for outer periphery has a shape substantially similar to the resist elimination region 25 and is configured to be allowed to apply the UV light to the resist elimination region 25 and a region (ring-shaped region including the line 22) slightly more inside than the resist elimination region 25.

When the edge shot is imprinted, the UV light is applied to the wafer W using the UV light source 53 for outer periphery, whereby the UV light can be applied to the ring-shaped region including the line 22 without using the aperture A.

The processing of applying the UV light to the curing light irradiation region 31 when the edge shot is imprinted is performed for each layer of a wafer process. Specifically, a processed film is formed on the wafer W, and then the resist 32 is coated on the processed film. Then, the wafer W coated with the resist 32 is imprinted while the UV light is applied to the UV light irradiation region, whereby, after that, the resist pattern is formed on the wafer W. Then, the lower layer side of the wafer W is etched using a resist pattern as a mask. According to this constitution, an actual pattern corresponding to the template pattern is formed on the wafer W. When a semiconductor device (semiconductor integrated circuit) is manufactured, the film formation, imprinting, the etching processing, and so on are repeated for each layer.

The resist 32 is not limited to a UV curable resin and may be a resin cured by a wavelength other than the UV light. Also in this case, light of a wavelength that can cure the resist 32 is applied to the resist 32.

As described above, according to the embodiment, since the UV light is applied to the curing light irradiation region 31 as the outer peripheral portion of the wafer W in the imprinting, the resist 32 can be prevented from entering inside the resist elimination region 25. Accordingly, imprinting can be performed while preventing the resist 32 from spreading in the undesired region of the outer peripheral portion of the wafer W.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprint method, comprising:
dropping resist in a pattern formation region more inside than an outermost peripheral region which is a region on a substrate where the resist is not desired to be entered at the time of imprinting;
pressing a template pattern of a template against the resist on the substrate for each imprint shot and thereby filling the resist in the template pattern for each imprint shot;
in the imprinting of the imprint shot including the outermost peripheral region, when the template pattern is pressed against the resist, applying first light curing the resist to a light irradiation region with a predetermined width including a boundary between the outermost peripheral region and the pattern formation region and curing the resist which is to enter inside the outermost peripheral region; and
applying second light, curing the resist filled in the template pattern, onto the template.

2. The imprint method according to claim 1, wherein when the resist is filled, a position alignment processing between a first alignment mark provided on the substrate and a second alignment mark provided on the template is performed, whereby the template is positionally aligned with respect to a predetermined position on the substrate, and when the resist is cured, the first light is applied to the light irradiation region during the position alignment processing.

3. The imprint method according to claim 1, wherein when the resist is filled, a position alignment processing between a first alignment mark provided on the substrate and a second alignment mark provided on the template is performed, whereby the template is positionally aligned with respect to a predetermined position on the substrate, and when the resist is cured, after the position alignment processing, the first light is applied to the light irradiation region during filling of the resist in the template pattern.

4. The imprint method according to claim 1, wherein when the resist which is to enter inside the outermost peripheral region is cured, the first light is applied to the light irradiation region through an aperture shielding light applied to other than the light irradiation region, and when the resist filled in the template pattern is cured, the second light is applied onto the template without interposition of the aperture.

5. The imprint method according to claim 1, wherein when the resist which is to enter inside the outermost peripheral region is cured, the first light is applied from a first light irradiation unit, irradiating the first light, to the light irradiation region, and when the resist filled in the template pattern is cured, the second light is applied from a second light irradiation unit, irradiating the second light, onto the template.

6. The imprint method according to claim 1, wherein the resist is a UV curable resin, and the light is UV light.

7. A method of manufacturing a semiconductor device, comprising:

dropping resist in a pattern formation region more inside than an outermost peripheral region which is a region on a substrate where the resist is not desired to be entered at the time of imprinting;

pressing a template pattern of a template against the resist on the substrate for each imprint shot and thereby filling the resist in the template pattern for each imprint shot;

in the imprinting of the imprint shot including the outermost peripheral region, when the template pattern is pressed against the resist, applying first light curing the resist to a light irradiation region with a predetermined width including a boundary between the outermost peripheral region and the pattern formation region and curing the resist which is to enter inside the outermost peripheral region;

applying second light, curing the resist filled in the template pattern, onto the template; and processing the substrate from above of cured resist and thereby forming a pattern on substrate, corresponding to the template pattern, on the substrate.

8. The method of manufacturing a semiconductor device according to claim 7, wherein when the resist is filled, a position alignment processing between a first alignment mark provided on the substrate and a second alignment mark provided on the template is performed, whereby the template is positionally aligned with respect to a predetermined position on the substrate, and when the resist is cured, the first light is applied to the light irradiation region during the position alignment processing.

9. The method of manufacturing a semiconductor device according to claim 7, wherein when the resist is filled, a position alignment processing between a first alignment mark provided on the substrate and a second alignment mark provided on the template is performed, whereby the template is positionally aligned with respect to a predetermined position on the substrate, and when the resist is cured, after the position alignment processing, the first light is applied to the light irradiation region during filling of the resist in the template pattern.

10. The method of manufacturing a semiconductor device according to claim 7, wherein when the resist which is to enter inside the outermost peripheral region is cured, the first light is applied to the light irradiation region through an aperture shielding light applied to other than the light irradiation region, and when the resist filled in the template pattern is cured, the second light is applied onto the template without interposition of the aperture.

11. The method of manufacturing a semiconductor device according to claim 7, wherein when the resist which is to enter inside the outermost peripheral region is cured, the first light is applied from a first light irradiation unit, irradiating the first light, to the light irradiation region, and when the resist filled in the template pattern is cured, the second light is applied from a second light irradiation unit, irradiating the second light, onto the template.

* * * * *